United States Patent
Nanjyo et al.

[11] Patent Number: 5,860,361
[45] Date of Patent: Jan. 19, 1999

[54] SCREEN PLATE CLEANING STATION

[75] Inventors: Hiromitsu Nanjyo; Isamu Gomikawa, both of Saitama, Japan

[73] Assignee: Toho Electronics Co., Ltd., Tokorozawa, Japan

[21] Appl. No.: 884,808

[22] Filed: Jun. 30, 1997

[30] Foreign Application Priority Data

Jun. 28, 1996 [JP] Japan ..................................... 8-169786
May 20, 1997 [JP] Japan ..................................... 9-130040

[51] Int. Cl.$^6$ ............................... B08B 3/02; B41F 35/00
[52] U.S. Cl. ..................... 101/424; 134/95.2; 134/199; 101/424.1; 101/425
[58] Field of Search ................................. 101/423, 424, 101/424.1, 425; 134/95.2, 199

[56] References Cited

U.S. PATENT DOCUMENTS

| | | | |
|---|---|---|---|
| 2,356,771 | 8/1944 | McKinley | 134/199 |
| 2,787,210 | 4/1957 | Shepard, Jr. | 400/155 |
| 3,401,668 | 9/1968 | Welsh et al. | 134/199 |
| 3,760,824 | 9/1973 | Edwards et al. | 134/199 |
| 3,865,298 | 2/1975 | Allen et al. | 134/199 |
| 4,023,486 | 5/1977 | Linthicum et al. | 101/120 |
| 4,717,426 | 1/1988 | Brynildsen | 101/425 |
| 4,808,237 | 2/1989 | McCormick et al. | 101/424 |
| 4,971,083 | 11/1990 | Stach et al. | 134/199 |

FOREIGN PATENT DOCUMENTS

| | | | |
|---|---|---|---|
| 31 00 656 A1 | 7/1982 | Germany | 101/425 |
| 61-213158 | 9/1986 | Japan | 101/425 |
| 2 088 284 | 6/1982 | United Kingdom | 101/425 |

Primary Examiner—Edgar Burr
Assistant Examiner—Leslie Grohusky
Attorney, Agent, or Firm—Ladas & Parry

[57] ABSTRACT

The present invention provides a screen plate cleaning station having nozzles for discharging a cleaning liquid to clean a screen plate which has been set in place, the station comprising a hood-like cleaning zone setting means which are provided on both sides of the screen plate in such a manner that their extremities are in contact with the both surfaces of the screen plate, thereby defining substantially equal cleaning zones on the both sides to prevent the cleaning liquid discharged from the nozzles from scattering.

11 Claims, 10 Drawing Sheets

SCREEN PLATE CLEANING STATION

BACKGROUND OF THE INVENTION

1. Field of the Invention

The present invention relates generally to a screen plate cleaning station for cleaning dirt adhered to a screen plate which is used for a stencil-type printing system to form printing patterns.

2. Description of the Prior Art

As well known, the stencil-type printing system using a meshed screen plate, which has hitherto been carried out in the printing industry, is contributing to a remarkable advancement in print wiring processing techniques through its application to mounting of electronic components in the field of electronic technology. Particularly, in the field of recent surface mount technology (SMT), a screen plate having a metal mask is used to form fine and close printed patterns composed of solder paste on a surface of a dielectric substrate made of e.g. epoxy resin. The thus formed printed patterns of solder paste are utilized to highly integrate the electronic components such as semiconductor devices or ICs to be mounted on the printed circuit board.

In addition, the field of application of the stencil-type printing system using the above screen plate is farther extended, including formation of resist ink on the dielectric substrate using a mask made of emulsion or resin, and application to printing means for indicating characters or symbols on electronic components with ink. In order to clean such a screen plate, various types of cleaning apparatuses have been proposed.

Figure 12:
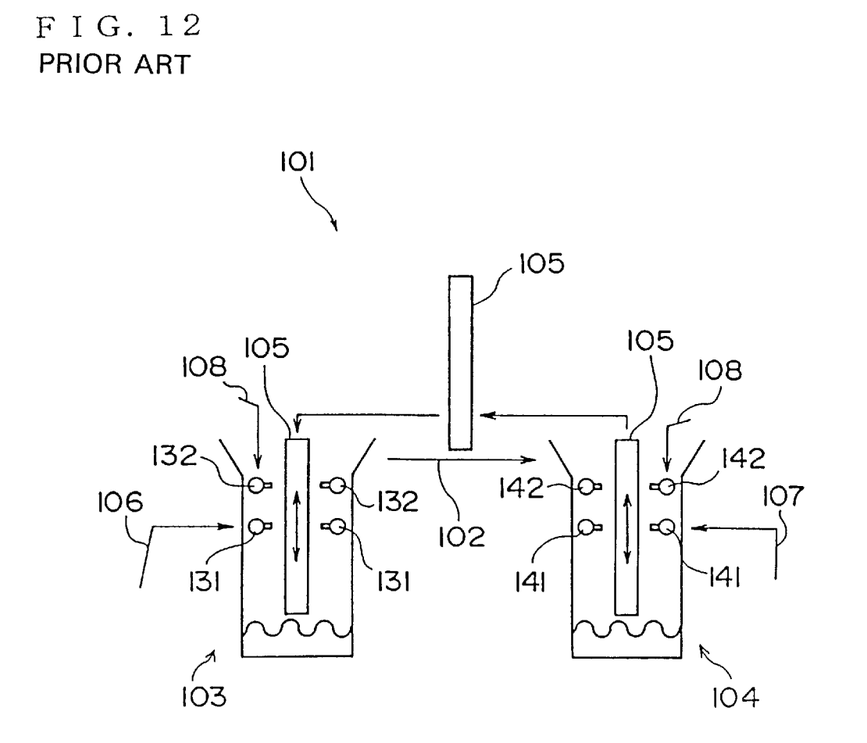
FIG. 12 is an explanatory diagram of a constrction of a conventional screen plate cleaning apparatus.

Referring to FIG. 12 there is depicted a construction of a conventional screen plate cleaning apparatus.

As shown in FIG. 12, the screen plate cleaning apparatus is generally designated at 101 and comprises a conveying mechanism 102, a cleaning vessel 103, cleaning nozzles 131, flashing nozzles 132, a rinsing vessel 104, rinsing nozzles 141, and dehydrating nozzles 142. Reference numeral 105 denotes a screen plate called a screen mask, 106 a cleaning liquid, 107 a rinsing liquid, and 108 a warm air.

The cleaning apparatus 101 shown in FIG. 12 cleans. the screen mask 105 through the following steps (1) to (6).
(1) The screen mask 105 is set in the cleaning apparatus 101.
(2) Power supply is turned on and cleaning conditions are determined.
(3) When the cleaning apparatus 101 is actuated, the screen mask 105 is conveyed to the cleaning vessel 103 by means of the conveying mechanism 102.
(4) The cleaning nozzles 131 vertically move to spray the cleaning liquid 106 at 40° C. An the form of a high-pressure shower onto the both surfaces of the screen mask 105.
(5) After cleaning operation, the flashing nozzles vertically move to blow the both surfaces of the screen mask 105 with the warm air 108 for dig up.
(6) The thus dried screen mask 105 is conveyed to the rinsing vessel 104 by means of the conveying mechanism 102. Through the rinsing step in the same manner, the screen mask 105 is returned to the initial setting position to complete the cleaning.

Besides, another type of conventional apparatus not shown is also known which additionally employs ultrasonic cleaning in the following steps (1) to (5) using a glycol ether cleaning liquid.
(1) A screen plate is set in the cleaning apparatus.
(2) A cleaning liquid is fed from a tank to rotational nozzles for spraying the cleaning liquid in the form of a rotational shower onto the screen plate, the cleaning liquid being reservoired inside the cleaning apparatus.
(3) An ultrasonic wave is applied to the interior of the thus reservoired cleaning liquid to perform ultrasonic cleaning while rotating the screen plate.
(4) The cleaning liquid is drawn into another tank and the screen plate is rotated to shake off the adhered cleaning liquid by the centrifugal force.
(5) Warm air is supplied onto the screen plate for drying.

However, the two conventional screen plate cleaning apparatus involve several problems that follows.
(1) In the case of for example a screen plate fitted with a metal mask, as will be described later, a printing metal mask is attached by an adhesive and via gauze to the inside of a metal frame. Then, using the screen plate fitted with the metal mask, solder paste is printed on the dielectric substrate by means of the stencil-type printing system.

On the other hand, the cleaning liquid adhered to the screen plate during the cleaning step will mostly volatile by virtue of the warm air in the drying step. However, a part of the cleaning liquid may remain left as it is for the time being as a result of infiltration into gaps at adhesive joints between the gauze and the above-mentioned mask and metal frame. Therefore, the cleaning liquid remaining in the gaps at the adhesive joints may possibly cause a chemical change of the adhesive to loosen the fixation of the mask. Also, the remaining cleaning liquid may act on the ink with which management numbers or types of machine to be applied are printed on the mask or the metal frame, which will result in unclear indications. Masks molded with emulsion and the like other than the metal mask will also suffer from the same problems, that is, loosened fixation of the mask due to a chemical change caused by the remaining cleaning liquid, or unclear ink-printed indications.
(2) In the prior art, a manual cleaning method was carried out in which the screen plate is cleaned up by hand with a rag infiltrated with 1,1,1-trichloroethane, although the use of this agent was prohibited thereafter from the medical point of view. Another agent could be used in place of the above agent but are poor in cleanability by themselves without using with machine, and are too strong in chemical odor to use them without providing any ventilating device.
(3) In the above two conventional apparatuses, the screen plate is entirely accommodated within the apparatuses so as to allow the cleaning liquid to be sprayed onto the entirety of the screen plate. The latter apparatus in particular is so configured that the screen plate is rotated for ultrasonic cleaning and that the cleaning liquid is shake-off dried by the centrifugal force. This will result in not only increase in size of the apparatus but also increase in the amount of consumption of the cleaning liquid as well as costs of production and maintenance. Above all, the screen plate cleaning apparatus 101 of FIG. 12 is of two-vessel type and is further provided with the conveying apparatus 102, with the result that its maintenance cost and the like is further raised.

The present invention was conceived to overcome the above problems which the conventional screen plate cleaning apparatus entails. It is therefore the object of the present invention t realize a compact and economical screen plate cleaning station with little or substantially no trouble, in which a zone to be necessarily cleaned on the screen plate is concentratedly cleaned to enhance the cleanability and the cleaning efficiency and in which the cleaning liquid is prevented from remaining in the gaps between the mask and the above-mentioned gauze and metal fame, with a simple structure.

SUMMARY OF THE INVENTION

According to the aspect of the present invention, there is provided a screen plate cleaning station having nozzles for discharging a cleaning liquid to clean a screen plate which has been set in place, the station comprising a hood-like cleaning zone setting means provided on both sides of the screen plate in such a manner that their extremities are in contact with the both surfaces of the screen plate, thereby defining substantially equal cleaning zones on the both sides to prevent the cleaning liquid discharged from the nozzles from scattering.

The present invention also provides a screen plate cleaning station making it possible to open one or both of the cleaning zone setting means.

The present invention also provides a screen plate cleaning station comprising the cleaning zone setting means having replaceable adapters for varying the screen plate cleaning zone.

The present invention also provides a screen plate cleaning station comprising the cleaning zone setting means whose tips are provided with resilient contact elements.

The present invention further provides a screen plate cleaning station having movable nozzles.

BRIEF DESCRIPTION OF THE DRAWINGS

The above and other objects, aspects, features and advantages of the present invention will become more apparent from the following detailed description in conjunction with the accompanying drawings, in which.

DESCRIPTION OF THE PREFERRED EMBODIMENTS

Embodiment 1

A first embodiment of the present invention will now be described with reference to the accompanying drawings. The first embodiment of the present invention exemplifies a case where a solder paste printed pattern is formed on a printed circuit board using a screen plate having a metallic mask commonly called "a metal mask" contributed by a thin metal sheet having therein a multiplicity of slit-like injection grooves extending in parallel with one another, as will be described hereinbelow.

Figure 1:
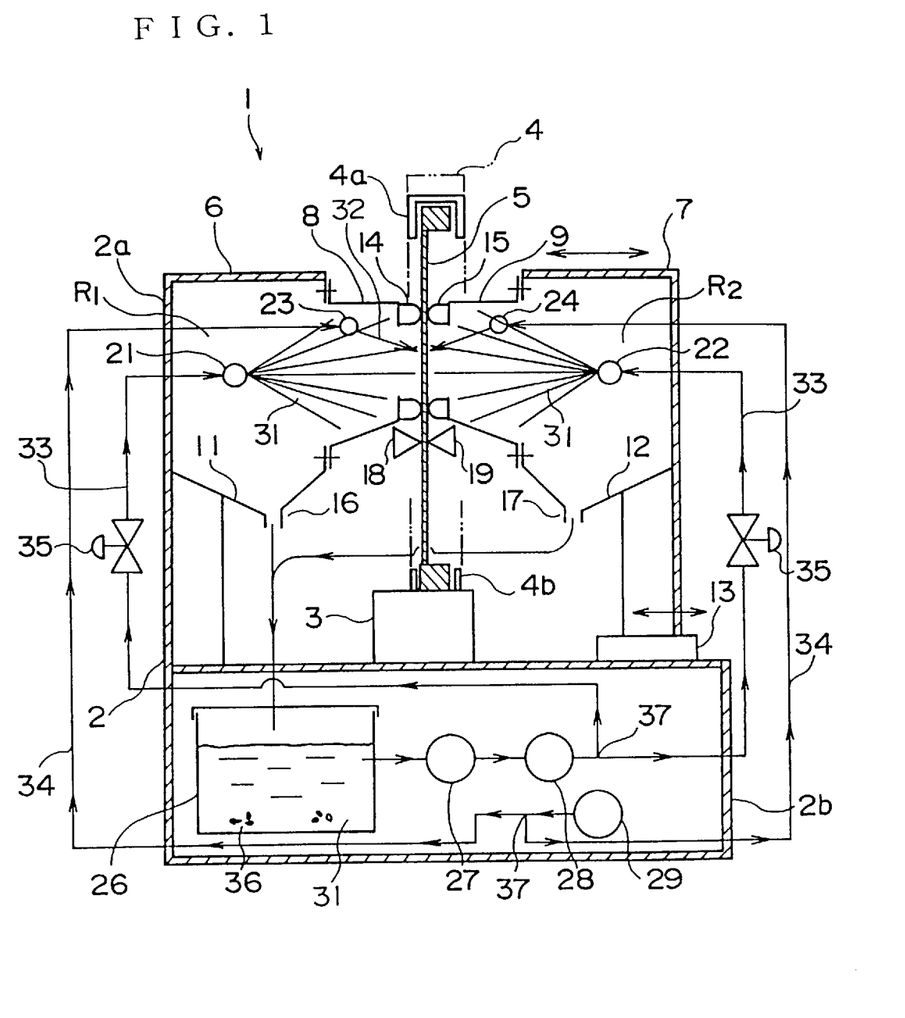
FIG. 1 is an explanatory diagram of a construction of a screen plate cleaning station according to a first embodiment of the present invention.
Figure 2:
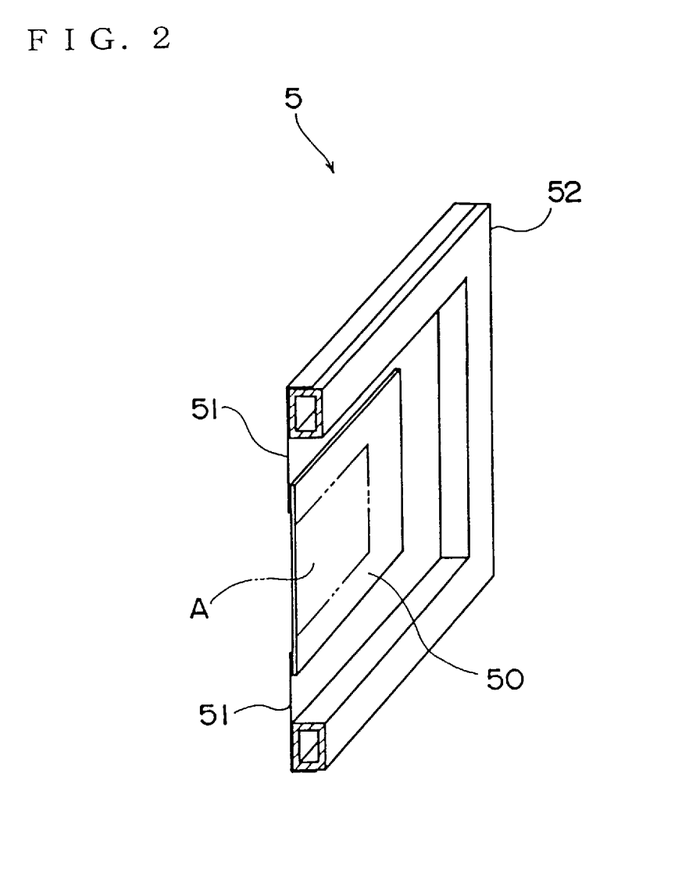
FIG. 2 is a explanatory diagram, in perspective section, of a screen plate according to the first embodiment of the present invention.

FIG. 1 is an explanatory diagram of a construction of a screen plate cleaning station according to the first embodiment of the present invention; and FIG. 2 is an explanatory diagram, in perspective section, of the screen plate.

Referring to FIG. 1 there is depicted a screen plate cleaning station which is generally designated at reference numeral 1 and comprises a housing 2 consisting of an upper housing 2a and a lower housing 2b. The screen plate cleaning station 1 includes a mount 3 provided in the upper housing 2a, and a holder 4 carrying thereon a screen plate 5 and consisting of a movable upper holder 4a and a fixed lower holder 4b. The holder 4 is indicated in its entirety by a chain double-dashed line and is arranged to be vertically movable on the mount 3, allowing the screen plate 5 as described below to be positioned in a vertically adjustable manner.

Referring to FIG. 2 there is shown a structure of the screen plate 5 comprising a mask 50, a flexible meshed gauze 51 made of a fabric such as a chemical fiber, and a rectangular setting frame 52. The setting fame 52 can be a hollow square bar of a light-weight and deformation-free metal such as aluminum. The gauze 51 is square frame-shaped and has an outer peripheral edge and an inner peripheral edge adhered to the setting frame 52 and the mask 50, respectively, allowing the mask 50 to be stretched in the center portion of a space defined by the setting frame 52 in such a manner as to be movable in the direction of the surface of the gauze 51.

Figure 3:
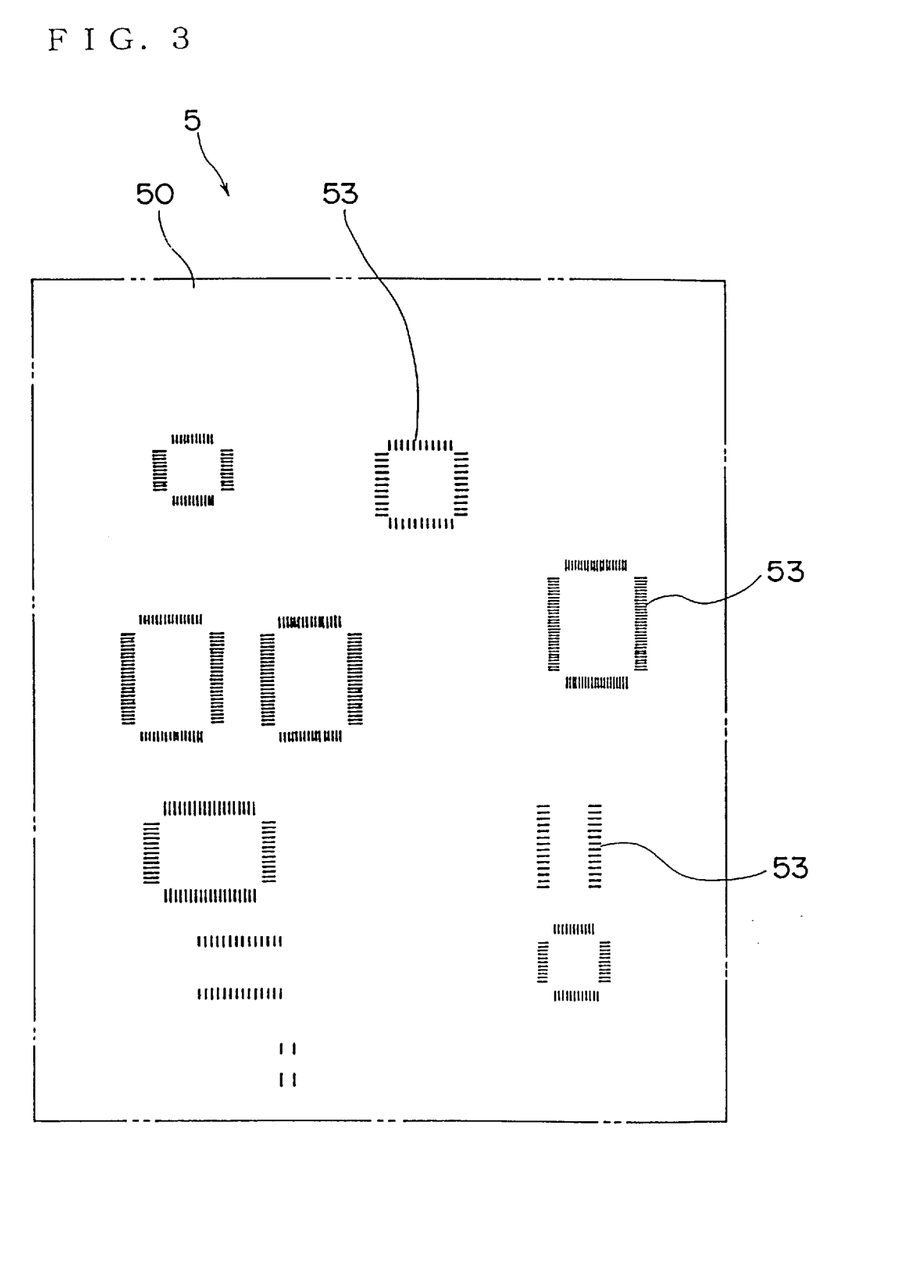
FIG. 3 is a partial top plan view of a mask of the first embodiment of the present invention.

In the vicinity of the center of the mask 50 being tensed for retainment in a floating manner within the frame, there are provided a injection grooves 53 consisting of plurality of narrow slit-like through-grooves into which solder paste for a reflow soldering is injected. FIG. 3 illustrates by way of example the injection grooves 53 provided in the mask 50. The arrangement and shapes of the injection grooves 53 depend on the positions of electrodes of surface mount devices (SMD) such as LSIs and ICs to be mounted on a substrate. The mask 50 can be in the form of a thin sheet having a thickness in the order of 150 $\mu$, made of copper, phosphor bronze or stainless steel. The injection grooves 53 are formed at predetermined positions by means of etching or laser processing.

Referring again to FIG. 1, the station 1 flirter comprises shells 6 and 7 constituting a part of the upper housing 2a; hood-like or hollow adapters 8 and 9 attached to the shells 6 and 7, respectively; partitions 11 and 12; a movable base 13 fixedly supporting the shell 7 and slidable in the direction of an arrow; and contact elements 14 and 15 made of corrosion-resistant elastic material and disposed at opening ends of the adapters 8 and 9, respectively. The contact elements 14 and 15 are in contact with the both faces of the screen plate 5 to serve as packing, thereby defining cleaning zones A (inside the region indicated by a chain double-dashed line in FIG. 2) having substantially the same area within the borderline joining the contacts on the both sides of the plate. Plural types of the adapters 8 and 9 are prepared in a replaceable manner so as to allow a selective setting of the cleaning zones A corresponding to the mask 50 of the set screen plate 5 and to the periphery of the mask 50.

The right and left partitions 11 and 12 are both funnel-shaped respectively having outflow ports 16 and 17 at their respective deepest portions. The interior spaces defined by the adapters 8 and 9 and the associated members constitute cleaning chambers R1 and R2, respectively, which are substantially symmetric with respect to the screen plate 5. Water pickup elements 18 and 19 are disposed below the adapters 8 and 9, respectively, and are brought into pressure contact with the both surfaces of the screen plate 5. A cleaning nozzle 21 and a drying nozzle 23 are arranged within the cleaning chamber R1, while a cleaning nozzle 22 and a drying nozzle 24 are arranged within the cleaning chamber R2. The lower housing 2b accommodates a tank 26 associated with a filter 27.

The lower housing 2b further accommodates a pump 28 for a cleaning liquid 31 connected to a pipeline 33, having a cock 35 incorporated therein, and a hot-air generator 29 for generating hot air 32 connected to a pipeline 34. Although not shown, the tank 26 has a side wall provided with a transparent window so as to allow a level of the cleaning liquid 31 stored within the interior to be monitored. Reference numeral 36 denotes solder balls, and 37 denotes a T pipe for branching each pipeline. The solder balls 36 are washed off from the screen plate 5 under the action of the cleaning liquid 31 discharged from the cleaning nozzles 21 and 22, and are deposited in the cleaning liquid 31 within the tank 26.

Description will now be given of an operation of the thus constructed first embodiment of the present invention.

The movable base 13 in the upper housing 2a is first driven to separate the right shell 7 from the left shell 6. The screen plate 5 to be cleaned is mounted on the holder 4. At that time, the upper holder 4a may be vertically moved so as to match the dimensions of the setting frame 52. The holder 4 on the mount 3 is then raised or lowered together with the screen plate 5, allowing portions to be cleaned to confront the cleaning nozzles 21 and 22. The movable base 13 is again driven in the reverse direction to cause the right shell 7 to come closer to left shell 6, thus allowing the contact elements 14 and 15 to come into contact with the screen plate 5 under a proper pressure. The contact of the contact elements 14 and 15 will seal the peripheral portions of the cleaning chambers R1 and R2, to be ready for cleaning.
[Cleaning Process]

When activating the pump 28 provided within the lower housing 2b, the cleaning liquid 31 is plumped from the interior of the tank 26, branches into the right and left pipelines 33 at the T pipe 37 and then is fed into the cleaning nozzles 21 and 22 under pressure. The cleaning liquid 31 fed under pressure into the cleaning nozzles 21 and 22 is then jetted against the both surfaces of the screen plate 5 to clean the inside of the cleaning zones A. In this case, the amount and pressure of the jetted cleaning liquid can be controlled by means of the cocks 35 provided on the midway of the right and left pipelines.

The cleaning liquid 31 jetted against the screen plate 5 washes off deposits such as solder paste by its showering cleaning effect and thereafter drops along the internal walls of the shells 6 aid 7. The thus dropped cleaning liquid is collected by the partitions 11 and 12 and is fed back to the interior of the tank 26, along with the washed-off solder paste or foreign particles, through the outflow ports 16 and 17 at the deepest portions. The solder paste mixed in the cleaning liquid 31 returned to the tank 26 is deposited on the bottom of the tank to form solder balls 36, which are in turn collected for reutilization with a proper collecting method at the time of shut-down of the screen plate cleaning station 1.
[Drying Process]

After tile completion of the showering cleaning within a preset period of time, a changeover takes place from the cleaning process using the cleaning nozzles 21 and 22 to the drying process using the drying nozzles 23 and 24. Upon the shift to the drying process, the hot air 32 is supplied from the hot-air generator 29 Through the pipeline 34 and is discharged from the drying nozzles 23 and 24. As a result of jetting of the hot air 32 from the drying nozzles 23 and 24, flashing and drying operation is effected on the screen plate 5 within a fixed period of time similar to that for the cleaning operation. In the case of the drying process as well, the drying nozzles 23 and 24 ensure an effective drying operation inside the cleaning region limited to a possible minimum area.

After the completion of drying of the screen plate 5 by the drying nozzles 23 and 24, the movable base 13 is driven to the right to open the shells 6 and 7. The upper holder 4a is moved upward to remove the cleaned screen plate 5. A new screen plate 5 to be next cleaned is mounted on the holder 4 and is subjected to the cleaning and drying operation in the same procedures as the above. In case the injection grooves 53 formed in the next screen plate 5 are different in position or shape from the last ones, the adapters 8 and 9 are replaced with other ones so as to selectively form appropriate cleaning zones A corresponding to the injection grooves 53.

The cleaned screen plate 5 thus removed is delivered to a printing process which will be described below and in which a solder paste is printed with the screen plate 5. In the above case, unexpected droplets may drop at the time of opening the shells 6 and 7. Also, in both the cleaning and drying processes, the cleaning liquid 31 may possibly leak out from gaps between the screen plate 5 and the contact elements 14 and 15 due to external factors such as vibrations. In order to allow for such an unexpected situation, the water pickup elements 18 and 19 are provided in a replaceable manner below the adapters 8 and 9, respectively. The water pickup elements 18 and 19 are made of a water absorptive material such as cloth and foam resin, and act to positively absorb the. above-described leaked liquid or droplets, through the intimate contact with the both surfaces of the screen plate 5.

From the printing process which follows, description will progress to SMT.
[Printing Process]

Figure 4A:
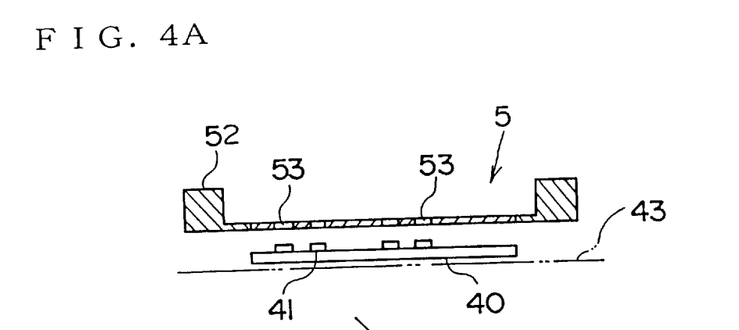
FIGS. 4A to 4C are explanatory diagrams showing a series of printing operations of the first embodiment of the present invention.
Figure 4B:
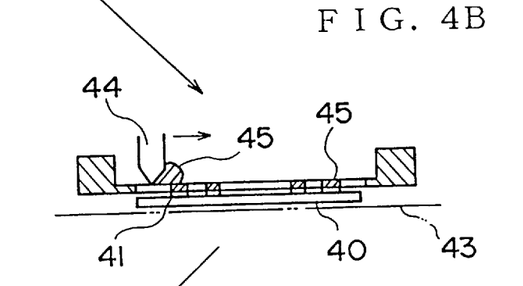
Figure 4C:
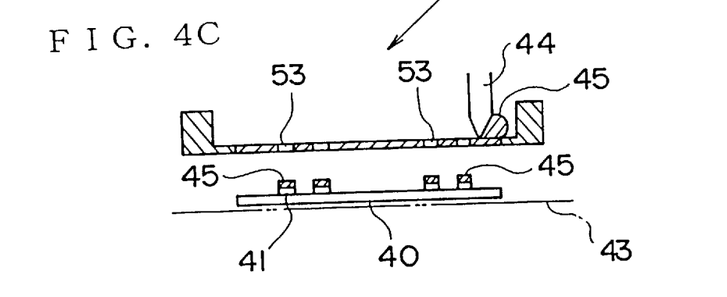

FIGS. 4A, 4B and 4C are an explanatory diagram of a printing operation by use of the screen plate 5.

Referring to FIGS. 4A, 4B and 4C, pads 41 made of electrically conductive films are formed on a surface of a substrate 40. Reference numeral 43 denotes a printing stage of a printing press not shown, 44 denotes a couple of squeegees (only one of which is shown) which slide horizontally in a transversely alternate manner, and 45 denotes solder paste having a semifluidity. The solder paste 45 is made by kneading flux into solder particles. The SMD is designated at reference numeral 47 and has an electrode 48 with solder 49 fixed thereon. (see also FIGS. 5 to 9)

In the printing process, the substrate 40 having the pads 41 formed thereon is first set on the printing stage 43. The screen plate 5 delivered to the printing process as described above is positioned above the substrate 40 as shown in FIG. 4A. The printing press recognizes the screen plate 5 and the substrate 40, and after positional correction, brings the vicinity of the mask 50 of the screen plate S into intimate contact with the substrate 40 in such a manner that the injection grooves 53 correspond in position to the pads 41. When the printing press is activated, as shown in FIG. 4B one squeegee 44 comes into contact with the surface of the screen plate 5 and slides thereon from left horizontally within the setting frame 52 as indicated by an arrow. The solder paste block 45 is thus rolled and forced into the interior of the injection grooves 53. Upon the completion of the forcing-in of the solder paste 45, the screen plate 5 is separated from the substrate 40 as shown in FIG. 4C.

Figure 5:
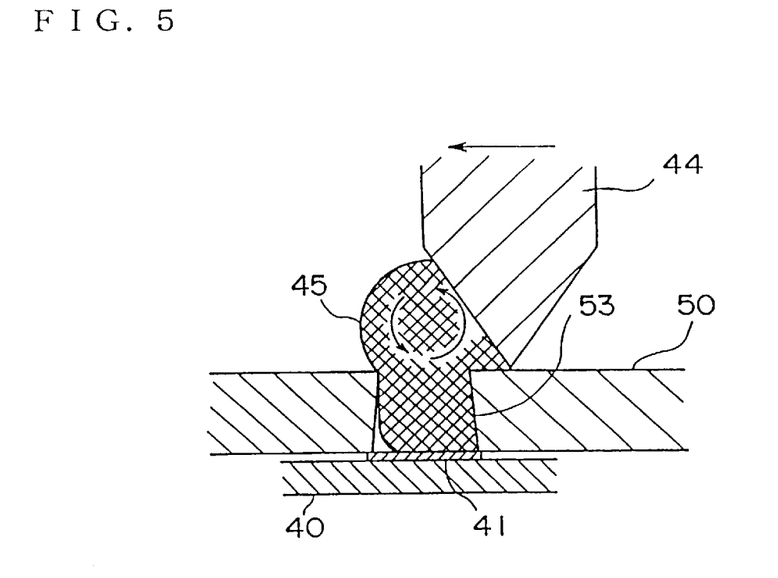
FIG. 5 is an enlarged sectional view showing the injecting operation of FIG. 4B.
Figure 6A:
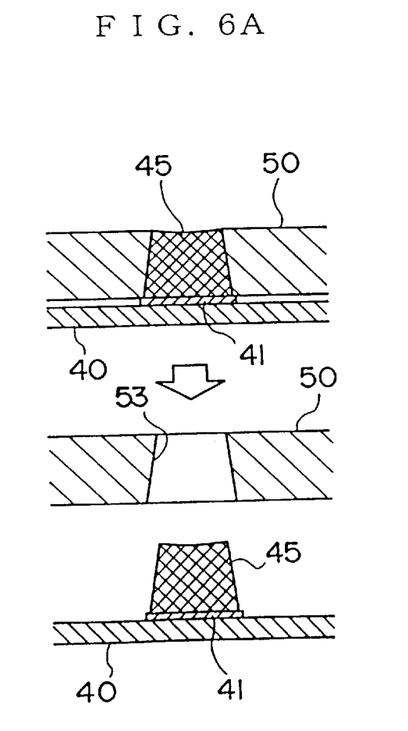
FIGS. 6A and 6B are sectional views showing the operation for separating a mask of the first embodiment of the present invention.
Figure 6B:
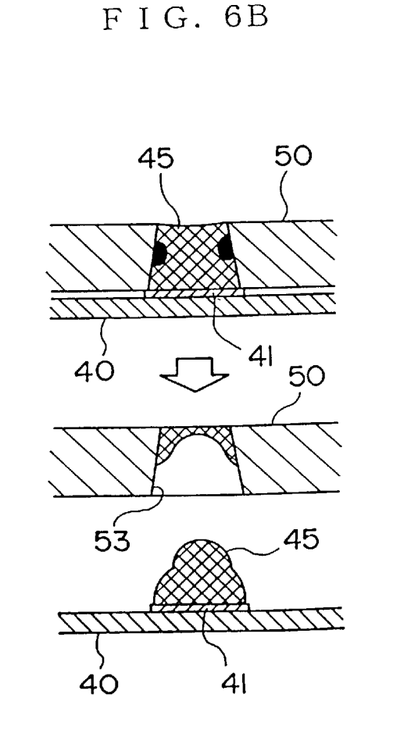

FIG. 5 illustrates in an enlarged manner the state where the solder paste 45 is forced into the injection groove 53 by means of the squeegee 44. In the case of a higher cleaning accuracy in the cleaning process, the solder paste 45 is molded to have a standard trapezoidal section with opposed slant edges equal to each other as shown in FIG. 6A. In case there exists a residue of the solder paste 45 after cleaning as indicated by blacked portions in FIG. 6B, there often appear sedimentary layer of solder paste 45 in the shape of "a snowman" as indicated by the lowermost diagram. Mounting of the SMD 47 with the solder paste 45 deformed as in FIG. 6B would cause a poor contact or malfunction.

When the printing operation of the solder paste 45 is complete in accordance with the above procedures, the substrate 40 is removed from the printing press. A new substrate 40 for the same applied machine is then set in the printing press and the squeegee 44 is swept from right to left in the same manner to print the solder paste 45 (FIG. 5). Subsequently, with the same operations, the solder paste 45 is printed which has a certain thickness and a shape corresponding to the injection groove 53. The substrate 40 which has undergone the printing operation is then transported to the next mounting step, although the screen plate 5 does not directly participate in the subsequent manufacturing process.

Figure 7:
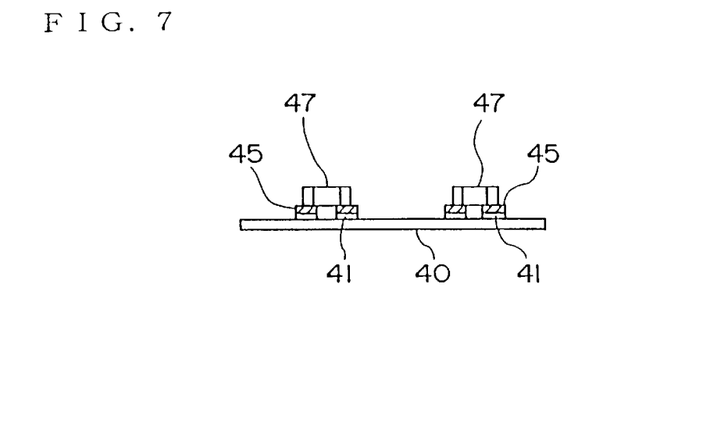
FIG. 7 is an explanatory diagram showing surface mount devices mounted on a substrate processed in the first embodiment of the present invention.
Figures 8A, 8B:
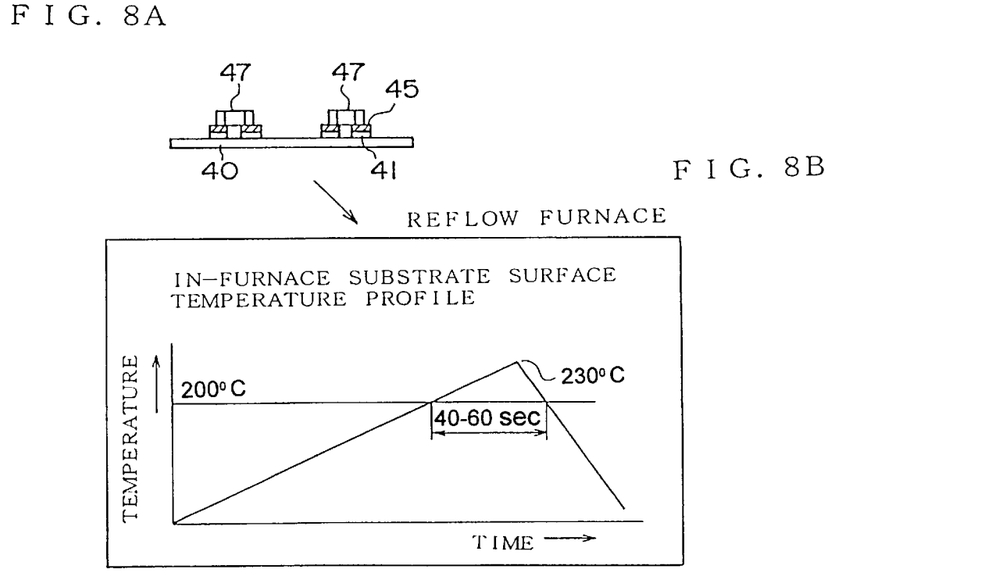
FIGS. 8A to 8C are explanatory diagrams of operations of a reflow step of the first embodiment of the present invention.
Figure 8C:
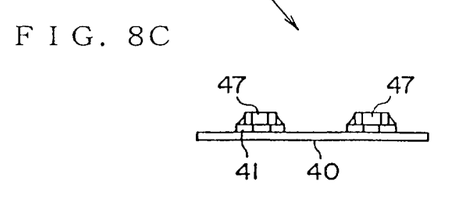
Figure 9:
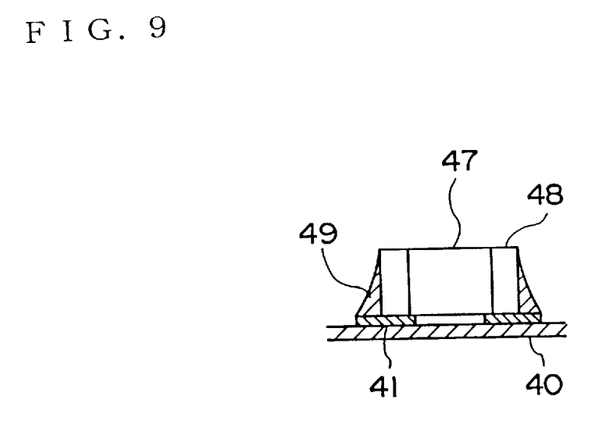
FIG. 9 is an enlarged sectional view of an SMD mounted on a substrate in the first embodiment of the present invention.

The substrate 40 transported to the mounting step in the production line is fed to a mounting machine in which the SMD 47 is set on top of the solder paste as shown in FIG. 7. The thus set SMD is retained with viscosity on the solder paste 45. Subsequently, the SMD 47 is subjected to a surface mounting through a reflow soldering using a reflowing furnace as shown in FIGS. 8A to 8C. FIG. 9 illustrates in an enlarged section the SMD 47 which has been mounted on the surface through the reflowing step.

Embodiment 2

Figure 10:
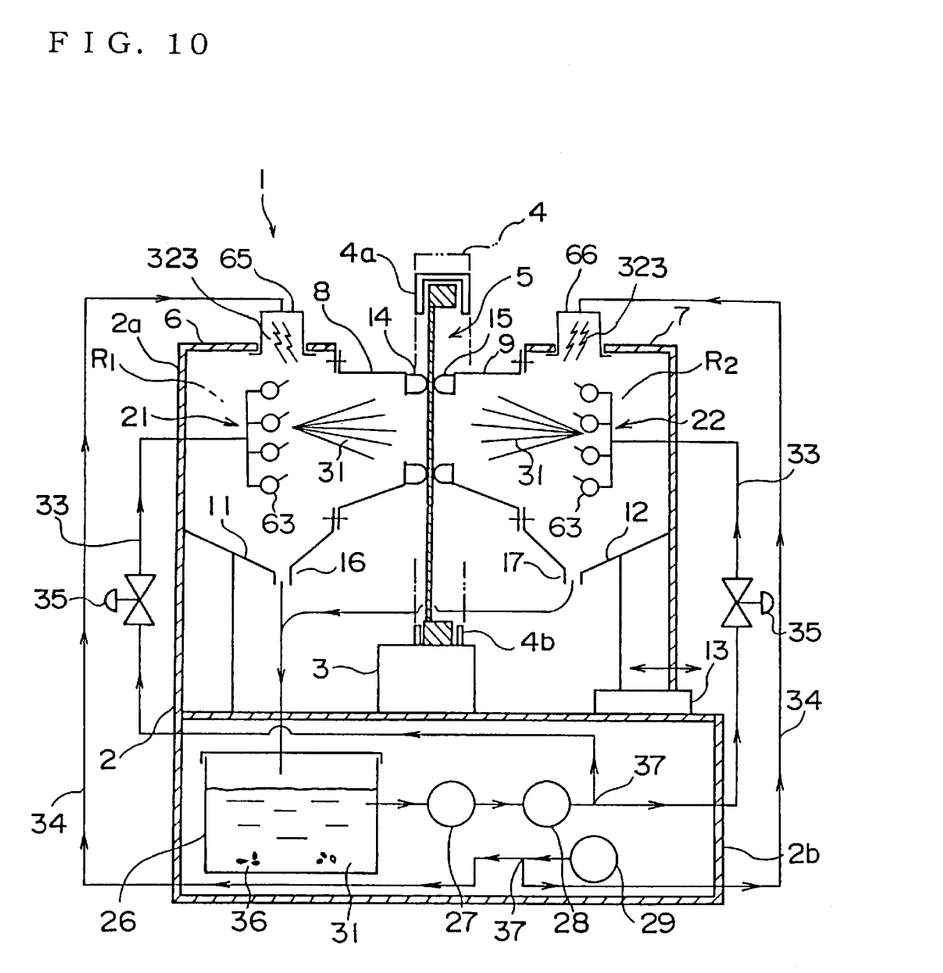
FIG. 10 is an explanatory diagram of a construction of a screen plate cleaning station according to a second embodiment of the present invention.
Figure 11:
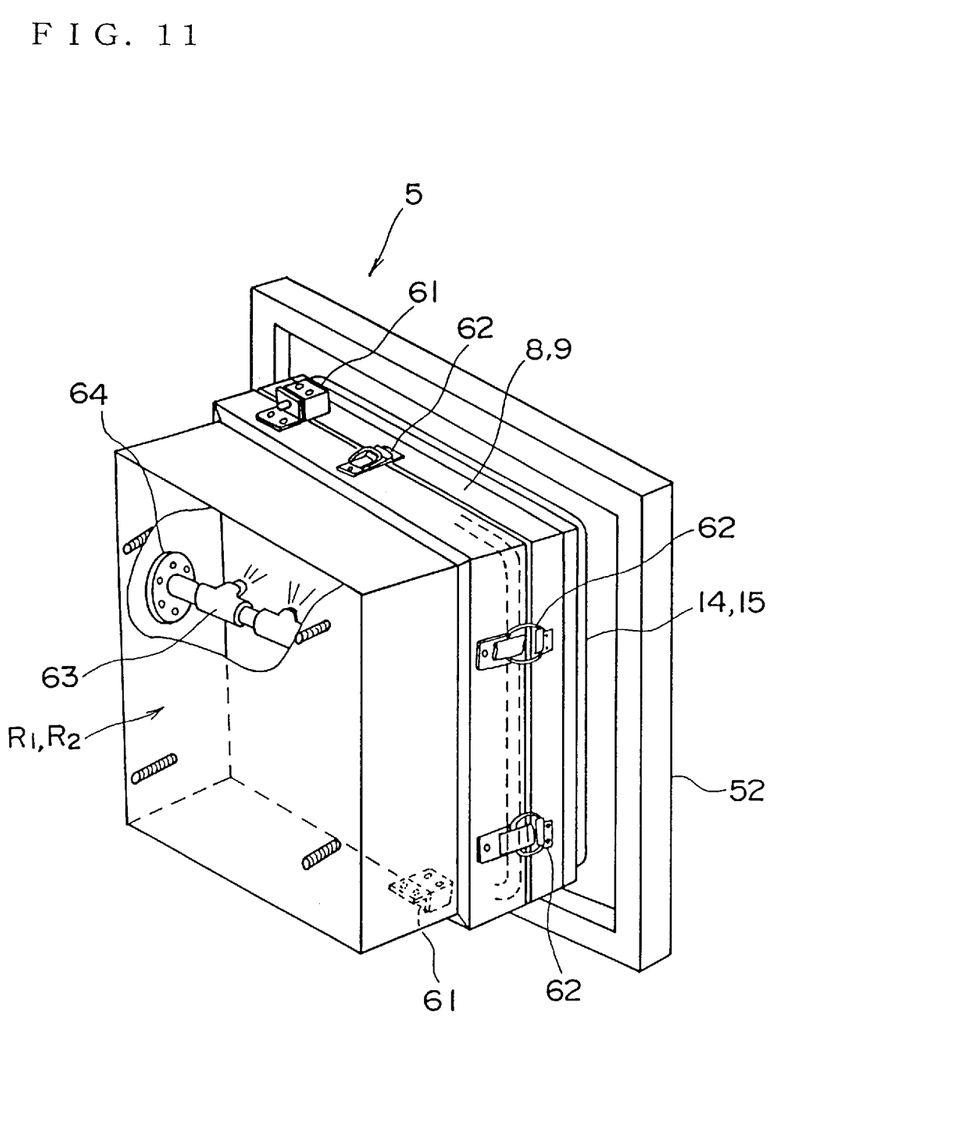
FIG. 11 is a perspective view showing a structure in the vicinity of a cleaning chamber of the second embodiment.

FIG. 10 is an explanatory diagram of a construction of a screen plate cleaning station according to a second embodiment of the present invention, and FIG. 11 is a perspective view showing a structure in the vicinity of the cleaning chamber.

The second embodiment differs mainly from the first embodiment in a nozzle for jetting the cleaning liquid and in the structure for discharging the hot air.

As is apparent from FIG. 10, the cleaning nozzles 21 and 22 for jetting the cleaning liquid 31 within the cleaning chambers R1 and R2, respectively, comprise a plurality of nozzles.

An exemplary structure of a part of the cleaning nozzle 21 or 22 is depicted in FIG. 11 which illustrates in perspective view the viciniy of the cleaning chamber R1 or R2.

In FIG. 11, reference numeral 61. denotes a positioning fitment, and 62 denotes a connecting lock. The upper and lower positioning fitments 61 serve to position the adapters 8 and 9 upon setting thereof, the adapters 8 or 9 being coupled via a plurality of connecting locks 62 to the shells 6 or 7, respectively in a replaceable manner. Reference numeral 63 denotes a liquid delivery tube in the cleaning nozzle 21 or 22, and 64 denotes a bearing plate.

In the second embodiment, as shown in FIG. 10, four-stage liquid delivery tubes 63 are horizontally arranged, a delivery tube 63 of each stage being provided with three nozzles, and a nozle group 21 or 22 consisting of a total of twelve nozzles are provided in the chambers R1 or R2, respectively. Outside the cleaning chambers R1 or R2, although not shown, the four-stage liquid delivery tubes 63 are coupled via links to a pneumatically operated cylinder mechanism. When the cylinder mechanism is reciprocatively actuated, the three nozzles disposed on each of the four-stage liquid delivery tubes 63 integrally tilt within an angular range of the order of 40 degrees so as to form a projected image of the jetted cleaning liquid 31 corresponding to the contour of the cleaning zone A.

In lieu of the drying nozzles 23 and 24 of the first embodiment, discharge ports 65 and 66 are provided which discharge the hot air 323 generated in the hot-air generator 29 into the interior of the cleaning chambers R1 and R2.

The hot air 323 discharged from the discharge ports 65 and 66 forms a drying atmosphere inside the cleaning chambers R1 and R2 each having substantially a sealed structure, thereby enabling the entire area of the cleaned screen plate 5 to be effectively dried by the drying atmosphere residing on both sides of the plate 5.

In the second embodiment, as described above, the projected image of the jetted cleaning liquid 31 is made to correspond to the contour of the cleaning zone A so as to improve the cleaning efficiency. By advantageously utilizing the substantially sealed cleaning chambers R1 and R2, the entire area of the screen plate 5 is dried within the atmosphere, thus achieving effective drying with a minimum amount of hot air 323 consumed.

Although description is given of a case in which the movable base slides in the above first embodiment of the present invention, a shell can be opened/closed using a hinge to turn the shell, and both the left and right shells can be of an opening/closing type. Furthermore, although description is given of a case in which the screen plate is dried by means of the two drying nozzles located above the right and left cleaning nozzles in the first embodiment, the cleaning nozzle and drying nozzle may be reversed in position, and naturally any number of nozzles may be provided or alternately a single drying nozzle may be provided for common use for cleaning and drying in a switchable manner. Also, in order to carry out a uniform spraying, the nozzle may be constructed to be turnable by use of e.g., fluid pressure of the cleaning liquid or hot air. It is also appreciated that the structures of the adapters, holders or contact elements are not necessarily limited to the above embodiments.

Thus, the present invention provides a screen plate cleaning station having nozzles for jetting cleaning liquid to clean a screen plate which has been set in place, the station comprising hood-like cleaning zone setting means which are provided on both sides of the screen plate in such a manner that their extremities are in contact with the both surfaces of the screen plate, thereby defining substantially equal cleaning zones on the both sides to prevent the cleaning liquid discharged from the nozzles from scattering.

The present invention also provides a screen plate cleaning station making it possible to open one or both of the cleaning zone setting means.

The present invention also provides a screen plate cleaning station comprising the cleaning zone setting means having replaceable adapters for varying the screen plate cleaning zone.

The present invention also provides a screen plate cleaning station comprising the cleaning zone setting means whose tips are provided with resilient contact elements.

The present invention further provides a screen plate cleaning station having movable nozzles.

As a result, according to the present invention, there are expected to be the following effects.

(1) Since the cleaning liquid is discharged from the nozzles for cleaning the screen plate in such a manner as to be localized onto a required cleaning zone which has been set, the cleaning liquid is prevented from being directed onto the surrounding gauze or adhesive joints between the gauze and both the mask and the setting frame. There are, therefore, the following advantages.

i) It is prevented that relative positions between the mask and the setting frame are displaced due to loosened fixation of the screen plate which arises from a deterioration in adhesive function of the adhesive caused by a chemical change by the cleaning liquid.

ii) Since the screen plate is not damaged, there is no need for surplus labor including resetting of the mask in the existing screen plate.

iii) Use of the gauze and adhesive does not affect directly the chemical components of the cleaning liquid, with the result that it become theoretically unnecessary to select the type of the cleaning liquid, which is advantageous in terms of cost.

(2) A partial cleaning in which the cleaning zone is restricted has the following advantages.

i) The cleaning station is compact and lightweight, which is convenient to the user.

ii) The compact and lightweight cleaning station results in a lower cost.

iii) Compact shell parts enable cleaning and drying to be performed with a small amount of cleaning liquid and hot air, respectively, which will contribute to a reduction in the amount of consumption of the cleaning liquid and the hot air as well as the power.

iv) Use of a powerful cleaning liquid suitable for cleaning will ensure an execution of prompt cleaning of the screen plate within a brief period of time.

Thus, according to the present invention, there is provided a compact and economical screen plate cleaning station with little or substantially no trouble, in which a zone to be necessarily cleaned on the screen plate is concentratedly cleaned to enhance the cleanability and the cleaning efficiency and in which the cleaning liquid is prevented from remaining in the gaps between the mask and both the gauze and the metal frame, with simple structure.

What is claimed is:

1. A screen plate cleaning station for cleaning a screen plate with jetted cleaning liquid, said station comprising:

a holder for vertically retaining a screen plate;

cleaning chambers provided on both sides of a screen plate retained by said holder, each of said cleaning chambers having an opening end opposite a screen plate and an outflow port of cleaning liquid at its bottom portion;

cleaning nozzles provided in said cleaning chambers to clean a screen plate by jetting cleaning liquid to both sides of a screen plate; and replaceable hollow adapters each detachably attached to said opening end of each cleaning element chamber, each of said adapters having an open contact end made of a packing material to define a cleaning zone by bringing said open contact end into contact with a screen plate.

2. A screen plate cleaning station according to claim 1, wherein the open contact ends of said adapters adapted to said cleaning chambers define substantially equal cleaning zones on both sides of a screen plate to prevent the cleaning liquid jetted from said cleaning nozzles from scattering.

3. A screen plate cleaning station according to claim 1, wherein said cleaning nozzles each comprise a multi-stage structure.

4. A screen plate cleaning station according to claim 1, wherein said cleaning nozzles are capable of rotational oscillation.

5. A screen plate cleaning station according to claim 1, further comprising drying nozzles provided in said cleaning chambers to jet hot air to a screen plate.

6. A screen plate cleaning station according to claim 1, further comprising discharge ports for discharging hot air into said cleaning chambers provided on the walls of said cleaning chambers.

7. A screen plate cleaning station according to claim 1, wherein said holder comprises a movable upper holder and a fixed lower holder.

8. A screen plate cleaning station according to claim 1, wherein said holder is in its entirety mounted on a mount in a vertically displaceable manner to make a set position of a screen plate vertically adjustable.

9. A screen plate cleaning station according to claim 1, further comprising a movable base which can horizontally slide for mounting one of said cleaning chambers so that said cleaning chambers on both sides of a screen plate can be opened.

10. A screen plate cleaning station according to claim 1, further comprising water pickup elements disposed below the open contact ends of said adapters.

11. A screen plate cleaning station according to claim 1, wherein a bottom of each of said cleaning chambers is formed in a shape of a funnel and said outflow port is disposed at a deepest portion of said bottom so as to collect said cleaning liquid for circulation.

* * * * *